United States Patent
Hassan et al.

(10) Patent No.: US 12,142,468 B2
(45) Date of Patent: Nov. 12, 2024

(54) STRESS TREATMENTS FOR COVER WAFERS

(71) Applicant: Applied Materials, Inc., Santa Clara, CA (US)

(72) Inventors: Vinayak Vishwanath Hassan, San Francisco, CA (US); Bhaskar Kumar, Santa Clara, CA (US); Meng Cai, Lynnfield, MA (US); Sowjanya Musunuru, Milpitas, CA (US); Kaushik Alayavalli, Sunnyvale, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 338 days.

(21) Appl. No.: 17/460,900

(22) Filed: Aug. 30, 2021

(65) Prior Publication Data

US 2023/0069395 A1    Mar. 2, 2023

(51) Int. Cl.
  *H01J 37/32*  (2006.01)
  *B24B 7/22*  (2006.01)
  *C23C 16/44*  (2006.01)

(52) U.S. Cl.
  CPC ........ *H01J 37/32862* (2013.01); *B24B 7/228* (2013.01); *C23C 16/4404* (2013.01); *H01J 37/32724* (2013.01); *H01J 2237/334* (2013.01); *H01J 2237/335* (2013.01)

(58) Field of Classification Search
  CPC ........... H01J 37/32862; H01J 37/32724; H01J 2237/334; H01J 2237/335; B24B 7/228; C23C 16/4404; H01L 21/6831
  See application file for complete search history.

(56) References Cited

U.S. PATENT DOCUMENTS

| | | | | |
|---|---|---|---|---|
| 5,810,937 | A | * | 9/1998 | Gupta ............... H01J 37/32862 204/192.12 |
| 7,060,622 | B2 | * | 6/2006 | Miyamori ................. C23C 4/02 257/E21.291 |
| 2004/0097359 | A1 | * | 5/2004 | Hiramatsu .............. C04B 35/46 264/619 |

(Continued)

FOREIGN PATENT DOCUMENTS

CN    1686944 A  * 10/2005
CN    110041068 A  *  7/2019

OTHER PUBLICATIONS

CN-110041068-A, Machine Translation, whole doc. (Year: 2023).*
CN-1686944-A, Machine Translation, whole doc. (Year: 2023).*

*Primary Examiner* — Duy Vu N Deo
*Assistant Examiner* — Christopher Remavege
(74) *Attorney, Agent, or Firm* — Kilpatrick Townsend & Stockton LLP

(57) ABSTRACT

Exemplary methods of manufacturing a semiconductor cover wafer may include sintering aluminum nitride particles into a substrate characterized by a thickness and characterized by a disc shape. The methods may include grinding a surface of the substrate to reduce the thickness to less than or about 2 mm. The methods may include polishing the surface of the substrate to reduce a roughness. The methods may include annealing the substrate at a temperature of greater than or about 800° C. for a time period of greater than or about 60 minutes.

19 Claims, 4 Drawing Sheets

(56) References Cited

U.S. PATENT DOCUMENTS

2005/0013989 A1* 1/2005 Hirose ................ H05K 3/4061
428/323
2014/0264388 A1* 9/2014 Schmitt .................. H01L 33/32
252/519.14
2014/0318575 A1* 10/2014 Parkhe .............. H01J 37/32862
279/157

* cited by examiner

STRESS TREATMENTS FOR COVER WAFERS

TECHNICAL FIELD

The present technology relates to semiconductor processing components and methods. More specifically, the present technology relates to methods of producing and utilizing cover wafers during semiconductor processing.

BACKGROUND

Integrated circuits are made possible by processes which produce intricately patterned material layers on substrate surfaces. Producing patterned material on a substrate requires controlled methods for forming and removing material. As device sizes continue to reduce, defects along deposited films may have a more detrimental effect. To limit defect formation and deposition, improved control of deposition parameters and chamber cleanings may be performed. However, these processes may be incapable or limiting defects at sufficiently small dimensions, which can still impact device performance.

Thus, there is a need for improved systems and methods that can be used to produce high quality devices and structures. These and other needs are addressed by the present technology.

SUMMARY

Exemplary methods of manufacturing a semiconductor cover wafer may include sintering aluminum nitride particles into a substrate characterized by a thickness and characterized by a disc shape. The methods may include grinding a surface of the substrate to reduce the thickness to less than or about 2 mm. The methods may include polishing the surface of the substrate to reduce a roughness. The methods may include annealing the substrate at a temperature of greater than or about 800° C. for a time period of greater than or about 60 minutes.

In some embodiments, the substrate further may include yttrium oxide. The thickness may be reduced from greater than or about 5 mm. The methods may include grinding an outer edge of the substrate to produce an outer diameter of less than 300 mm. The outer diameter of the substrate may be greater than 298 mm. The substrate may be annealed at a temperature of greater than or about 1000° C. for a time period of greater than or about 400 minutes. The substrate may be annealed at a temperature of greater than or about 1500° C. for a time period of greater than or about 150 minutes. The annealing may be performed in an oxygen-free atmosphere. The annealing may be performed in a nitrogen atmosphere.

Some embodiments of the present technology may encompass methods of semiconductor processing. The methods may include seating a cover wafer on a substrate support within a processing region of a semiconductor processing chamber. The methods may include heating the cover wafer to a processing temperature. The methods may include cleaning the processing region with a plasma etch process. The methods may include seasoning the processing region of the semiconductor processing chamber. The methods may induce a tensile bow of the cover wafer of less than or about 300 nm per cycle.

In some embodiments, the methods may include removing the cover wafer from the semiconductor processing chamber. The methods may include seating a substrate on the substrate support. The methods may include performing a deposition operation on the substrate. The methods may include removing substrate from the semiconductor processing chamber. The methods may include repeating the method of semiconductor processing. The cover wafer may be or include aluminum nitride. The cover wafer may include yttrium oxide. The cover wafer may be characterized by a thickness of greater than or about 0.8 mm. The cover wafer may be characterized by an outer diameter of between about 298 mm and about 300 mm.

Some embodiments of the present technology may encompass methods of manufacturing. The methods may include sintering aluminum nitride particles into a substrate characterized by a thickness and characterized by a disc shape. The methods may include grinding a surface of the substrate to reduce the thickness to less than or about 2 mm. The methods may include polishing the surface of the substrate to reduce a roughness. The methods may include annealing the substrate at a temperature of greater than or about 800° C. for a time period of greater than or about 60 minutes. The annealing may be performed in an oxygen-free environment.

In some embodiments the methods may include grinding an outer edge of the substrate to produce an outer diameter of less than 300 mm. The outer diameter of the substrate may be greater than 298 mm. The substrate may be annealed at a temperature of greater than or about 1000° C. for a time period of greater than or about 400 minutes. The substrate may be annealed at a temperature of greater than or about 1500° C. for a time period of greater than or about 150 minutes.

Such technology may provide numerous benefits over conventional systems and techniques. For example, the processes may produce cover wafers that limit or prevent bowing due to processing conditions. Additionally, the cover wafers may be capable of hundreds of additional cycles due to improved stress characteristics, which can reduce replacement and operational costs. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
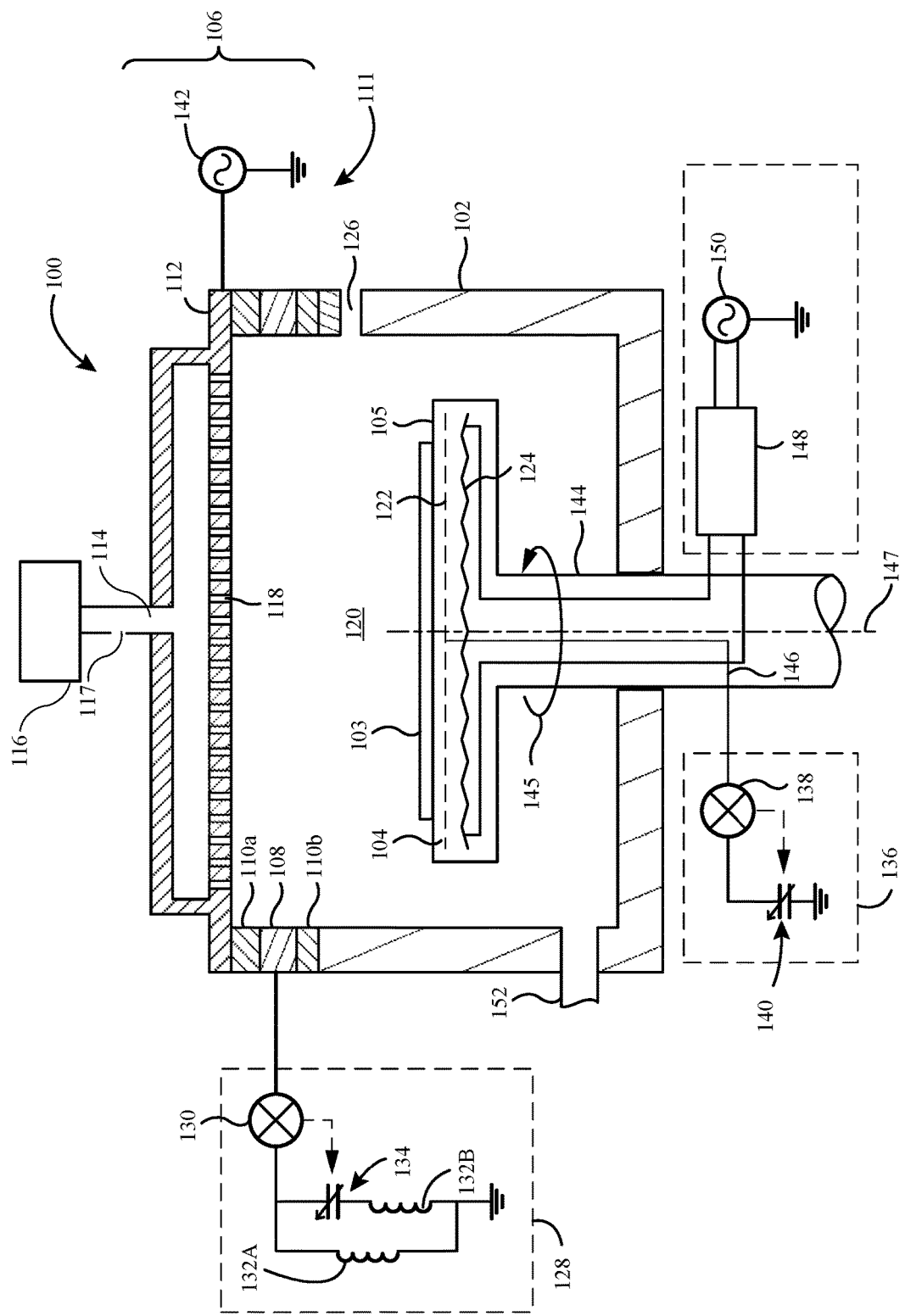
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Deposition operations in semiconductor processing may be included to form any number of materials on a substrate. For example, materials may be deposited on a substrate to produce semiconductor structures, as well as to facilitate patterning or removal of materials on a substrate. Regardless of the mechanism, many deposition operations deposit materials not only on the substrate being processed, but on chamber components as well. For example, in a processing region, deposition may occur on a substrate as well as a pedestal or support on which the substrate is seated, faceplates or diffusers that may distribute materials into the processing region, chamber walls defining the processing region, and components defining exhaust pathways for materials and byproducts subsequent to deposition.

Once the deposition process is completed, the substrate may be removed from the processing region, and the chamber may be cleaned for the next wafer to be processed. The cleaning process may utilize plasma effluents of reactive materials. Because the substrate was positioned to receive deposition products during processing, once the substrate is removed, the substrate support or puck, such as a vacuum or electrostatic chuck, may be exposed to the cleaning materials. To limit or prevent this exposure, a cover wafer may be delivered to the processing region to protect the puck of the substrate support. After cleaning, a chamber seasoning may be formed to protect surfaces prior to subsequent deposition, and this seasoning may be deposited on the cover wafer as well. The cover wafer may then be removed, and a new processing substrate or wafer may be delivered for subsequent deposition.

Conventional technologies have struggled to maintain cover wafers for a sufficient period of time, and tend to replace the components every few hundred cycles or less. The exposure of the cover wafer to the chamber and processing environments can change properties of the cover wafer over time. For example, when cover wafers are produced, a grinding operation may be performed, as well as a polishing operation, which may induce an amount of stress in the cover wafer materials. During use, the cover wafer may be heated up to several hundred degrees and back, and exposed to plasma species. This exposure may cause the stress to relax over time, which may create a tensile bow of the cover wafer, exposing more area of the substrate support. This can allow particles during seasoning to be deposited under the cover wafer, as well as the buildup of low-quality residue from deposition. During subsequent processing, backside gas flow may then distribute these particles, which may produce defects on the processing wafer, such as a silicon wafer. This can lead to scrapped or damaged wafers, and typically results in replacement of the cover wafer.

The present technology may overcome these limitations by performing processes to redistribute stress on the cover wafer. This may allow the cover wafer to be exposed to the cleaning and seasoning environment for many more cycles, as the stress relaxation may have less effect. This can greatly reduce operation costs from damaged wafers as well as cover wafer replacement compared to conventional technologies. After describing general aspects of a chamber according to embodiments of the present technology in which plasma processing operations discussed below may be performed, specific processes and operations according to embodiments of the present technology will be described. It is to be understood that the present technology is not intended to be limited to the specific chambers or processing discussed, as the techniques described may be used to improve a number of processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Inlet 114 may include delivery from a remote plasma source unit 116, which may be fluidly coupled with the chamber, as well as a bypass 117 for process gas delivery that may not flow through the remote plasma source unit 116 in some embodiments. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2A:
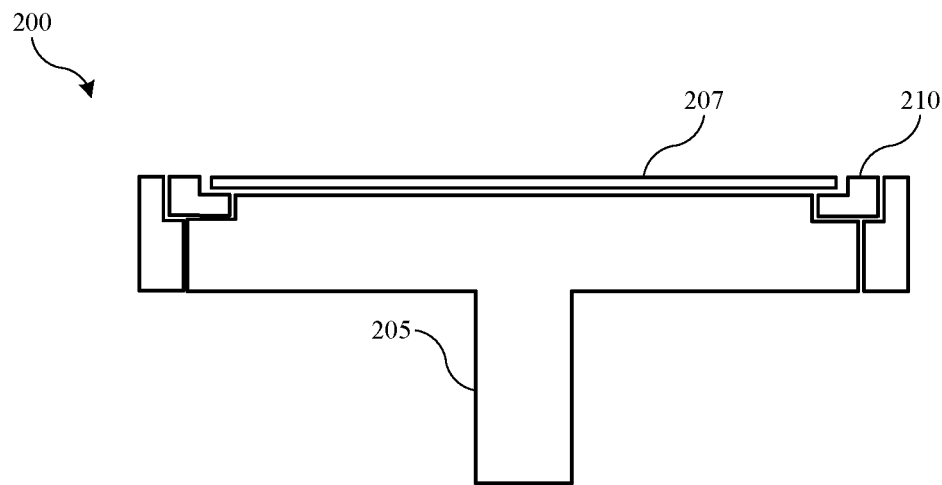
FIGS. 2A-2C show schematic views of substrates and cover wafers on a substrate support according to some embodiments of the present technology.
Figure 2B:
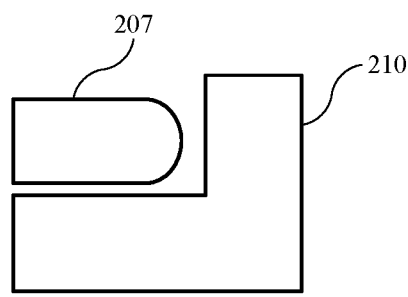
Figure 2C:
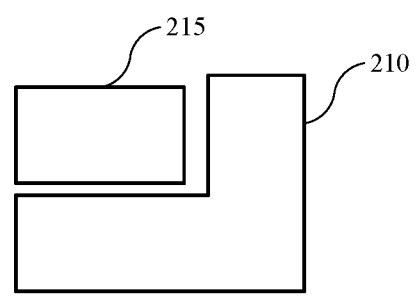

Turning to FIGS. 2A-2C are shown schematic views of substrates and cover wafers on an exemplary substrate support structure according to some embodiments of the present technology, and which may illustrate additional details of substrate support 104 described above. As shown in FIG. 2A, substrate support 200 may include a pedestal 205 or structure on which the substrate 207 is seated. The structure may include any of the features or components as previously described. About the pedestal 205 may be an edge ring 210, which may control flow of materials to control access on the bevel and backside of the substrate. As shown, the substrate may at least partially extend onto the edge ring 210.

FIG. 2B shows a detailed view of the bevel or edge of substrate 207 with respect to the edge ring 210. Semiconductor substrates may be characterized by any variety of dimensions, but many wafers may be 300 mm in diameter, and characterized by a height of less than 800 µm. The wafer may also have a beveled edge as illustrated. These features, along with the extension height of the edge ring, may impact the amount of deposition materials that flow between the substrate and the edge ring into the corner of the edge ring. FIG. 2C illustrates a cover wafer 215 positioned on the substrate support and the relationship with edge ring 210. As shown, the cover wafer may be characterized by a greater height than the wafer, and may also be characterized by less of a bevel, although rounding of the edges may occur. This height differential can affect the ability of cleaning materials to penetrate between the cover wafer the edge ring, which may allow particle buildup to occur.

Accordingly, in some embodiments, a diameter of the cover wafer may be produced to be less than a diameter of a corresponding wafer to facilitate access for cleaning species, and thus, in some embodiments the cover wafer may be characterized by an outer diameter of less than or about 300 mm, such as less than or about 299.5 mm, less than or about 299.0 mm, less than or about 298.5 mm, less than or about 298.0 mm, or less. However, to ensure that the cover wafer extends past the pedestal portion and onto the edge ring in order to minimize gaps, the outer diameter may be greater than or about 295 mm, and may be greater than or about 296 mm, greater than or about 297 mm, greater than or about 298 mm, or more. Some semiconductor substrates or wafers may be characterized by a notch or flat edge about the substrate at one location, which allows alignment. In some embodiments, the cover wafer may also be characterized by a notch or flat edge about the cover wafer at a location which may correspond to the notch of a semiconductor substrate and ensure cleaning at that location.

As explained above, cover wafers according to embodiments of the present technology may be exposed to cleaning processes including plasma cleaning that can include halogen, oxygen, or other etchants. Additionally, cover wafers may be exposed to temperature cycling. For example, in one non-limiting example, a cover wafer may be stored in the factory interface of the mainframe when not in use. The factory interface may be maintained at ambient temperature, which may cool the cover wafer from processing temperatures. Once deposited in the processing chamber in which deposition occurs, the cover wafer may be exposed to temperatures greater than or about 200° C., and may be exposed to temperatures greater than or about 250° C., greater than or about 300° C., greater than or about 350° C., greater than or about 400° C., greater than or about 450° C., or more. This transition between higher and lower temperatures, as well as exposure to plasma effluents, may affect internal stress of the cover wafer as described previously. Accordingly, to prepare cover wafers for these environmental exposures, the present technology may perform operations to mitigate the intrinsic stresses generated during the fabrication operations.

Figure 3:
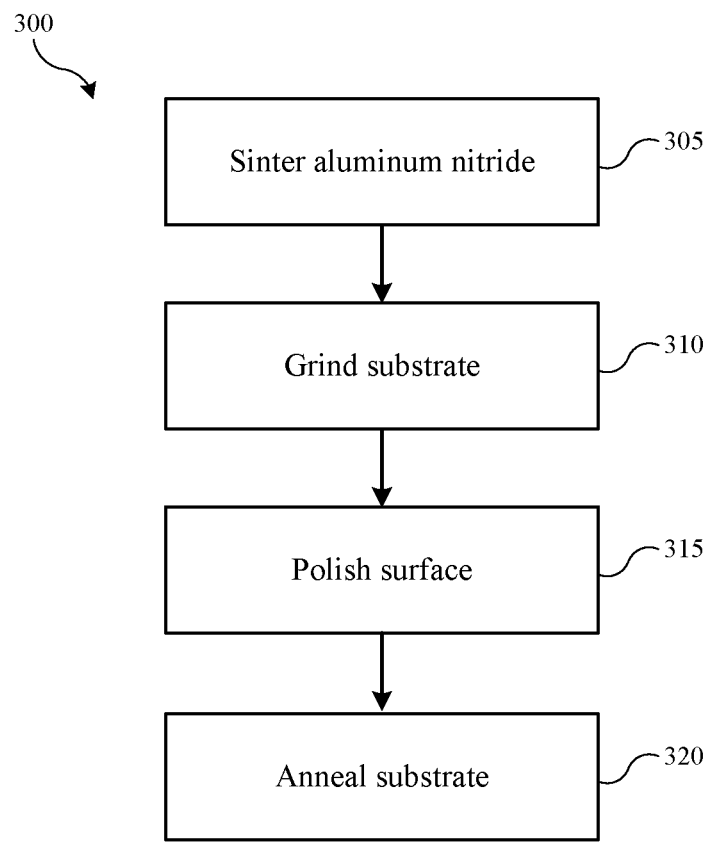
FIG. 3 shows exemplary operations in method of manufacturing a semiconductor processing cover wafer according to some embodiments of the present technology.

FIG. 3 shows exemplary operations in a method 300 of manufacturing a semiconductor processing cover wafer according to some embodiments of the present technology. Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. The process of developing cover wafers according to embodiments of the present technology may include methods of controlling or mitigating stress effects induced during the fabrication process. By reducing intrinsic stress in the cover wafer, heat cycling and plasma exposure may have reduced effects on the cover wafer, which may limit bowing over time, and thereby increase the number of uses for the cover wafer.

At operation 305, method 300 may include a process of forming a base substrate to be used as a cover wafer, which may include sintering one or more particles into a substrate at high temperature and pressure, which may be any temperatures and pressures suitable for materials noted here. Cover wafers according to some embodiments of the present technology may include insulative or dielectric materials. For example, oxides, nitrides, carbides, and other materials may be used to form the substrate, which may be a monolithic disc, and materials may also include a range of polymeric materials, including polystyrene or other materials, including cross-linked materials. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties or other characteristics of the components. Exemplary dopant materials may include yttrium, magnesium, silicon, iron, calcium, chromium, sodium, nickel, copper, zinc, or any number of other elements known to be incorporated within a ceramic or dielectric material, as well as oxides, nitrides, or carbides of any of these materials.

To produce a cover wafer having more uniform material characteristics throughout the substrate, and to limit cracking and deformation, the sintering process may be used to produce a substrate characterized by a first thickness that may be greater than a final thickness for use. The substrate may be any number of shapes including oval or rectilinear shapes, and in some embodiments the substrate may be a disc. The disc may be sintered to produce a substrate characterized by a thickness of greater than or about 2 mm, greater than or about 3 mm, greater than or about 4 mm, greater than or about 5 mm, or more. The substrate may then be processed to produce a cover wafer, such as by performing grinding and polishing operations.

For example, at operation 310, the method may include grinding one of the surfaces down to produce a disc characterized by a second thickness that may be less than the first thickness. In some embodiments, the substrate may be ground to a thickness of less than or about 2 mm, and may be ground to a thickness of less than or about 1.9 mm, less than or about 1.8 mm, less than or about 1.7 mm, less than or about 1.6 mm, less than or about 1.5 mm, less than or about 1.4 mm, less than or about 1.3 mm, less than or about 1.2 mm, less than or about 1.1 mm, less than or about 1.0 mm, less than or about 0.9 mm, less than or about 0.8 mm, or less. Although the substrate may be ground on either side, in some embodiments the grinding may be performed on one side of the substrate. Additionally, the substrate may be ground about an edge to produce a cover wafer characterized by any of the outer diameters noted above, as well as to produce a notch or flat edge, although in some embodiments the mold in which the sintering is performed may be sized to produce a substrate characterized by the desired outside diameter and shape.

At operation 315, a polishing operation may be performed on the surface on which grinding occurred in order to reduce the surface roughness of the cover wafer. Because deposition and etching materials will contact the surface, reducing surface roughness may limit damage and facilitate removal of materials from the surface. Accordingly, the polishing operation may reduce the average surface roughness to less than or about 100 µm, and may reduce the average surface roughness to less than or about 80 µm, less than or about 70 µm, less than or about 60 µm, less than or about 50 µm, less than or about 40 µm, less than or about 30 µm, less than or about 20 µm, or less. This may produce a complete cover wafer according to the specification of the size and material characteristics.

However, grinding and polishing operations may cause an amount of stress incorporation within the crystal structure of the substrate. For example, grinding may cause a high amount of force on the structure, which may induce a stress on the crystalline structure. These stress characteristics may be incorporated into the materials, but when exposed to heat cycling and plasma processing as explained above, may be released over time. This may cause a tensile bow to occur as the stress releases. To prevent this effect, some embodiments of the present technology may include an operation after the grinding to reduce or mitigate these stress effects. For example, at operation 320, the methods may include annealing the substrate, or the formed cover wafer, at high temperature in order to reduce stress within the material structure.

The annealing process may be performed to allow recrystallization to occur, which may allow the grain structure to adjust to the induced stress, and release the stress caused by fabrication. Because the sintering may produce a polycrystalline material, the annealing process may be performed near a recrystallization temperature of one or more materials used in the cover wafer. However, the temperature may be controlled to limit alternative phase formation. Accordingly, in some embodiments the annealing process may be performed at a temperature of greater than or about 800° C., and may be performed at a temperature of greater than or about 900° C., greater than or about 1000° C., greater than or about 1100° C., greater than or about 1200° C., greater than or about 1300° C., greater than or about 1400° C., greater than or about 1500° C., or more. To limit phase change and diffusion, the annealing process may be performed at a temperature of less than or about 1800° C., and may be performed at a temperature of less than or about 1700° C., less than or about 1600° C., or less. The annealing process may change the morphology of the cover wafer by changing the grain orientation. Macroscopically the cover wafer may be the same, although microscopically new grains may form and adjust to relieve the stress induced from grinding operations.

The annealing process may be performed for a period of time to facilitate reorganization, and thus in some embodiments the annealing may be performed for greater than or about 150 minutes, and may be performed for greater than or about 200 minutes, greater than or about 250 minutes, greater than or about 300 minutes, greater than or about 350 minutes, greater than or about 400 minutes, greater than or about 450 minutes, greater than or about 500 minutes, or more. Utilizing higher temperatures may allow a shorter anneal time to be performed in some embodiments, which may facilitate production. Additionally, although the anneal may be performed in an ambient environment, in some embodiments the anneal process may be performed in an oxygen-free environment, which may prevent oxidation of some materials incorporated in the cover wafer. Accordingly, in some embodiments the annealing may be performed in a nitrogen environment, or other inert gas environment, such as argon, for example. By performing annealing according to embodiments of the present technology, inherent stress in the cover wafer may be released, which may reduce an effect over time for wafer bow, as will be further described below.

Figure 4:
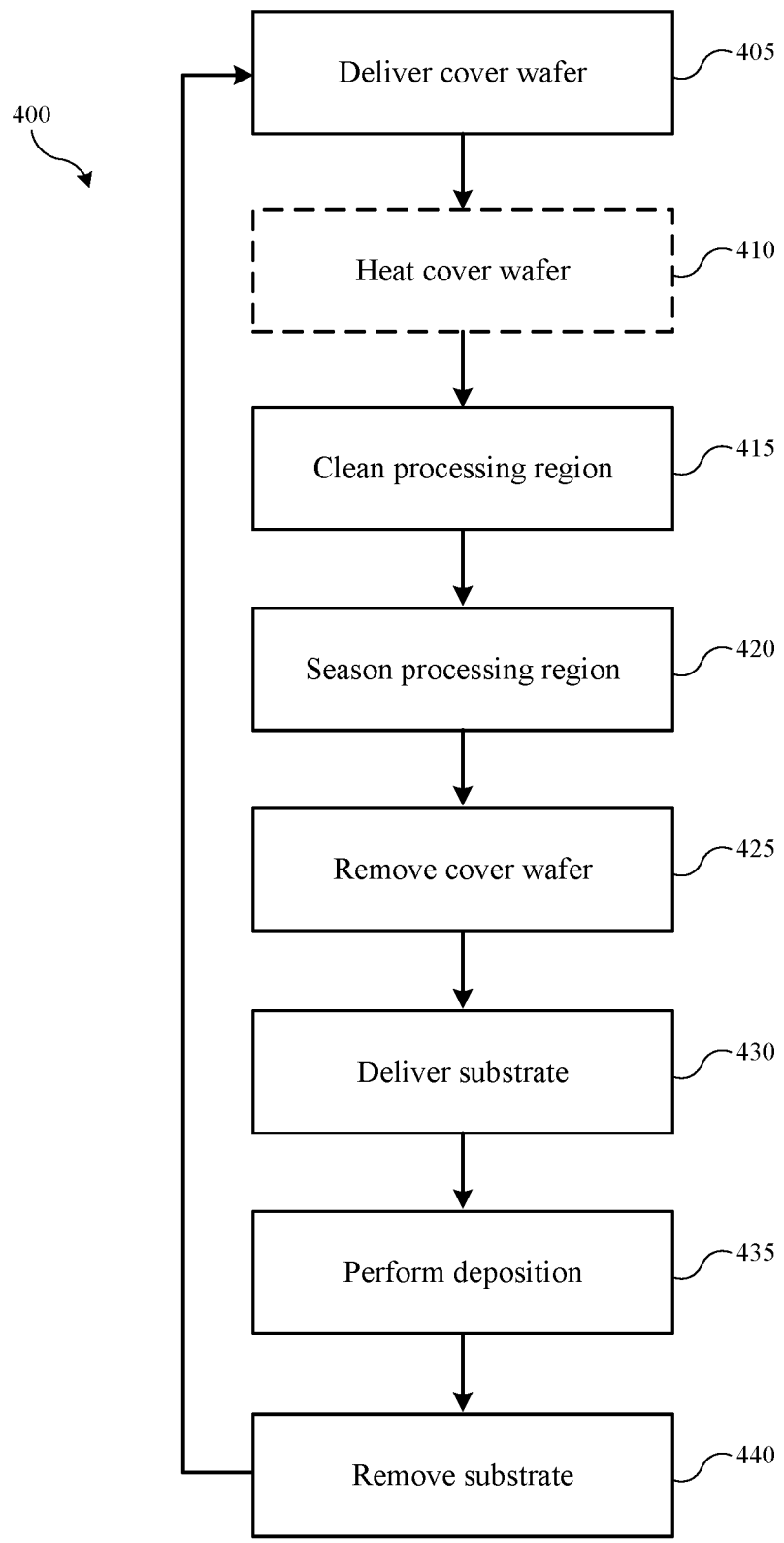
FIG. 4 shows exemplary operations in method of semiconductor processing utilizing cover wafers according to some embodiments of the present technology.

Cover wafers produced according to some embodiments of the present technology may be used in semiconductor processing operations, which may have a reduced bowing effect on the cover wafer each cycle. FIG. 4 shows exemplary operations in a method 400 of semiconductor processing utilizing cover wafers according to some embodiments of the present technology. The method may be performed in a variety of processing chambers, including processing chamber 100 described above, as well as any other chambers in which the operations may be performed. Method 400 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 400 may include a processing method that may include a number of operations for preparing chambers for deposition processing.

At operation 405, method 400 may include delivering a cover wafer to a processing chamber. Although method 400 is being described from the operation of providing the cover wafer, it is to be understood the method may begin at any operation of the cycle to be described. For example, operation 405 may occur after a substrate has been removed from a processing chamber after a deposition operation has been performed. As explained previously, the cover wafer may have been kept at ambient temperature, or below a processing temperature, such as a temperature below or about 100° C. Once delivered to a processing region of a semiconductor processing chamber and seated on a substrate support, the cover wafer may be heated on the substrate support to any of the processing temperatures noted above. The cover wafer may be characterized by any of the features described previously, and may have been fabricated according to any operation described above.

Method 400 may include cleaning the processing region at operation 415. The cleaning operation may include a plasma clean in some embodiments, such as may use halogen-containing precursors or plasma effluents, oxygen-containing precursors or plasma effluents, or any number of other materials, or plasma effluents that may be generated within the process chamber or remotely. The cleaning process may remove residual deposition material from surfaces of the processing chamber, as well as from an exposed surface of the cover wafer, which may be the polished surface in some embodiments. After the cleaning operation has completed, method 400 may include a seasoning process at operation 420. The seasoning process may include any number of deposition processes, including plasma-enhanced deposition on exposed surfaces of the processing region, and which may also be formed on the cover wafer positioned on the substrate support. The seasoning material may include silicon-containing materials, carbon-containing materials, or any number of other materials that may coat chamber surfaces prior to a deposition operation.

At operation 425, the cover wafer may be removed from the processing region, and may be stored anywhere within the tool, including within a factory interface, which may be maintained at ambient temperature, or any temperature below processing temperatures described above. At operation 430, a semiconductor substrate, such as a wafer, may be delivered to the seasoned processing region and seated on the pedestal. A deposition operation may be performed at operation 435, which may form or deposit any number of materials on the substrate. The deposition may be any of a number of techniques, including plasma-enhanced deposition. After deposition has completed, the semiconductor substrate may be removed from the processing region at operation 440. The cover wafer may be delivered back into the processing region, and any one or more operations of method 400 may be performed.

Conventional cover wafers may have been prone to tensile bow that increases over time, based on the release of stress caused during fabrication, as explained above. After a period of time, the cover wafer may bow upward sufficiently to allow deposition to occur under the cover wafer, as each cycle of the process on average may increase tensile stress leading to bowing of greater than or about 500 nm, greater than or about 600 nm, or more. By releasing stress during the fabrication process as previously described, tensile stress of the cover wafer that can lead to bowing may be maintained on average each cycle of method 400 to less than or about 500 nm, and may be maintained at less than or about 450 nm, less than or about 400 nm, less than or about 350 nm, less than or about 300 nm, less than or about 250 nm, less than or about 200 nm, less than or about 150 nm, less than or about 100 nm, less than or about 50 nm, or less. This may allow cover wafers produced according to embodiments of the present technology to be used for hundreds or thousands more cycles than previous cover wafers.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of manufacturing cover wafers, the method comprising:
   sintering aluminum nitride particles into a substrate characterized by a thickness and characterized by a disc shape to form a cover wafer;
   grinding a surface of the cover wafer to reduce the thickness to less than or about 2 mm;
   polishing the surface of the cover wafer to reduce a roughness; and
   annealing the cover wafer at a temperature of greater than or about 800° C. for a time period of greater than or about 60 minutes.

2. The method of manufacturing of claim 1, wherein the cover wafer further comprises yttrium oxide.

3. The method of manufacturing of claim 1, wherein the thickness is reduced from greater than or about 5 mm.

4. The method of manufacturing of claim 1, further comprising:
   grinding an outer edge of the cover wafer to produce an outer diameter of less than 300 mm.

5. The method of manufacturing of claim 4, wherein the outer diameter of the cover wafer is greater than 298 mm.

6. The method of manufacturing of claim 1, wherein the cover wafer is annealed at a temperature of greater than or about 1000° C. for a time period of greater than or about 400 minutes.

7. The method of manufacturing of claim 1, wherein the cover wafer is annealed at a temperature of greater than or about 1500° C. for a time period of greater than or about 150 minutes.

8. The method of manufacturing of claim 1, wherein the annealing is performed in a nitrogen atmosphere.

9. A method of manufacturing cover wafers, the method comprising:

sintering aluminum nitride particles into a substrate characterized by a thickness and characterized by a disc shape to form a cover wafer;
grinding a surface of the cover wafer to reduce the thickness to less than or about 2 mm;
polishing the surface of the cover wafer to reduce a roughness; and
annealing the cover wafer at a temperature of greater than or about 800° C. for a time period of greater than or about 60 minutes, wherein the annealing is performed in an oxygen-free environment.

10. The method of manufacturing cover wafers of claim 9, further comprising:
grinding an outer edge of the cover wafer to produce an outer diameter of less than 300 mm, wherein the outer diameter of the cover wafer is greater than 298 mm.

11. The method of manufacturing cover wafers of claim 9, wherein the cover wafer is annealed at a temperature of greater than or about 1000° C. for a time period of greater than or about 400 minutes.

12. The method of manufacturing cover wafers of claim 9, wherein the cover wafer is annealed such that stress induced by the grinding and the polishing is relieved through recrystallization and a formation of new microscopic grains in the cover wafer.

13. The method of manufacturing cover wafers of claim 9,
wherein the cover wafer protects a substrate support while having an induced tensile bow of less than or about 300 nm.

14. The method of manufacturing cover wafers of claim 9, the method further comprising:
grinding an outer edge of the cover wafer to produce an outer diameter of less than a diameter of a substrate that is replaced by the cover wafer on a substrate support during a cleaning process.

15. The method of manufacturing cover wafers of claim 9, the method further comprising:
grinding an outer edge of the cover wafer to produce an outer diameter to be greater than an inner diameter of an edge ring in which the cover wafer is seated during a cleaning process.

16. The method of manufacturing cover wafers of claim 9, the method further comprising:
forming a notch or flat edge in the cover wafer at a location corresponding to a notch in a substrate that is replaced by the cover wafer on a substrate support during a cleaning process.

17. The method of manufacturing cover wafers of claim 9, wherein grinding the surface of the cover wafer results in a thickness that is greater than a thickness of a substrate that is replaced by the cover wafer on a substrate support during a cleaning process.

18. The method of manufacturing cover wafers of claim 9, wherein the cover wafer comprises less of a bevel than that of a substrate that is replaced by the cover wafer on a substrate support during a cleaning process.

19. The method of manufacturing cover wafers of claim 9, wherein polishing the surface of the cover wafer reduces an average surface roughness of the cover wafer to be less than about 100 micrometers.

* * * * *